United States Patent
Felicilda

(10) Patent No.: US 9,771,122 B1
(45) Date of Patent: Sep. 26, 2017

(54) MOTORCYCLE HAND CONTROL WITH OPTICAL SENSOR

(71) Applicant: Harley-Davidson Motor Company Group, LLC, Milwaukee, WI (US)

(72) Inventor: Geovani Felicilda, Mukwonago, WI (US)

(73) Assignee: Harley-Davidson Motor Company Group, LLC, Milwaukee, WI (US)

( * ) Notice: Subject to any disclaimer, the term of this patent is extended or adjusted under 35 U.S.C. 154(b) by 65 days.

(21) Appl. No.: 15/078,093

(22) Filed: Mar. 23, 2016

(51) Int. Cl.
| | |
|---|---|
| *B62K 23/02* | (2006.01) |
| *B62K 21/12* | (2006.01) |
| *B62K 21/26* | (2006.01) |
| *B60Q 1/34* | (2006.01) |
| *H03K 17/968* | (2006.01) |

(52) U.S. Cl.
CPC .............. *B62K 23/02* (2013.01); *B60Q 1/343* (2013.01); *B62K 21/12* (2013.01); *B62K 21/26* (2013.01); *H03K 17/968* (2013.01)

(58) Field of Classification Search
CPC combination set(s) only.
See application file for complete search history.

(56) References Cited

U.S. PATENT DOCUMENTS

| | | | |
|---|---|---|---|
| 4,191,866 A | 3/1980 | Nakajima et al. | |
| 6,950,635 B1 * | 9/2005 | Miyamaru | A42B 3/303 455/100 |
| 7,652,563 B2 | 1/2010 | Kuhnly et al. | |
| 7,933,631 B2 | 4/2011 | Kim | |
| 8,193,650 B2 * | 6/2012 | Thorne | B62B 7/002 290/1 R |
| D704,705 S | 5/2014 | Mehin et al. | |
| 8,810,482 B2 | 8/2014 | Abdollahi et al. | |
| 2009/0073112 A1 | 3/2009 | Basson et al. | |

(Continued)

FOREIGN PATENT DOCUMENTS

| | | |
|---|---|---|
| EP | 3315498 | 5/1989 |
| EP | 2868559 | 6/2015 |

(Continued)

OTHER PUBLICATIONS

"User Friendly Optical TrackPad," <http://www.crucialtec.com/eng/business_otp.php> accessed Jun. 25, 2015 (6 pages).

(Continued)

*Primary Examiner* — Kevin Hurley
*Assistant Examiner* — Gabriela C Craciun
(74) *Attorney, Agent, or Firm* — Michael Best & Friedrich LLP

(57) ABSTRACT

A handlebar assembly for steering a vehicle includes a handlebar, a grip positioned on the handlebar at a first end of the handlebar assembly, and a hand control assembly positioned adjacent the grip. The hand control assembly includes an optical sensor. The optical sensor has a housing with a light transmissive section, a light source configured to emit light, and a light sensor configured to detect light. The light source and the light sensor are positioned at least partially within the housing. The optical sensor is operable to detect movement of a vehicle operator along the light transmissive section of the housing by detecting reflected light from the light source with the light sensor.

20 Claims, 7 Drawing Sheets

(56) References Cited

U.S. PATENT DOCUMENTS

| | | | |
|---|---|---|---|
| 2009/0080207 A1* | 3/2009 | Hurwitz | B60Q 1/2615 |
| | | | 362/464 |
| 2010/0001974 A1 | 1/2010 | Su et al. | |
| 2010/0156851 A1* | 6/2010 | Kurokawa | G06F 3/0412 |
| | | | 345/175 |
| 2011/0035039 A1* | 2/2011 | Simard | B60K 26/02 |
| | | | 700/101 |
| 2012/0235902 A1 | 9/2012 | Eisenhardt et al. | |
| 2014/0059472 A1 | 2/2014 | Zhaiek et al. | |
| 2015/0146449 A1* | 5/2015 | Freiser | B62J 6/04 |
| | | | 362/523 |
| 2015/0274242 A1* | 10/2015 | Osanai | B60K 23/02 |
| | | | 74/491 |
| 2015/0274248 A1* | 10/2015 | Osanai | B62K 23/04 |
| | | | 74/471 R |
| 2016/0107517 A1* | 4/2016 | Larray | B62H 3/00 |
| | | | 180/220 |
| 2016/0116356 A1* | 4/2016 | Goldstein | B62J 99/00 |
| | | | 73/1.15 |

FOREIGN PATENT DOCUMENTS

| | | |
|---|---|---|
| EP | 2868560 | 6/2015 |
| JP | 2014019442 | 2/2014 |

OTHER PUBLICATIONS

"BlackBerry 8520 Optical TrackPad 24168-001," <www.amazon.com/Original-BlackBerry-Optical-TrackPad-24168-001/dp/8003R9NL5W> accessed Jun. 11, 2015 (1 page).

* cited by examiner

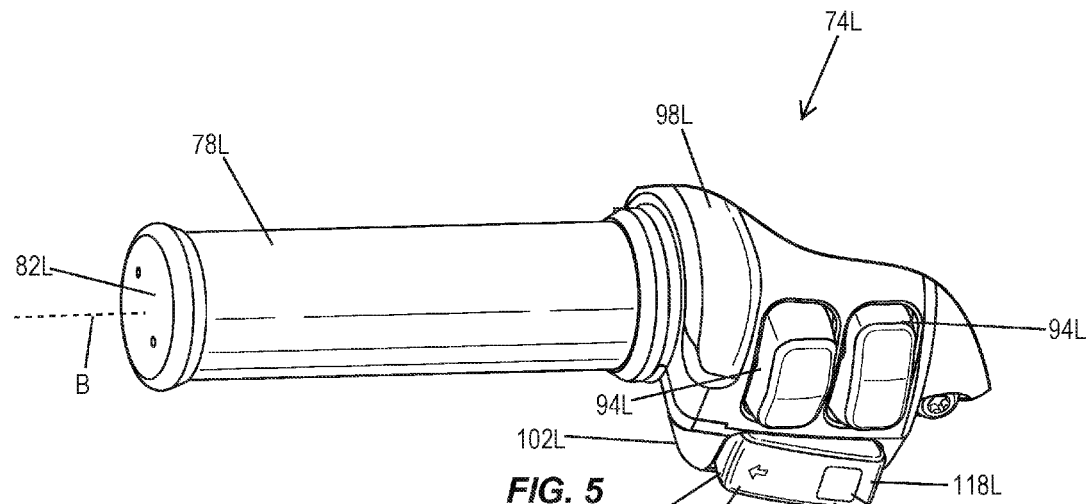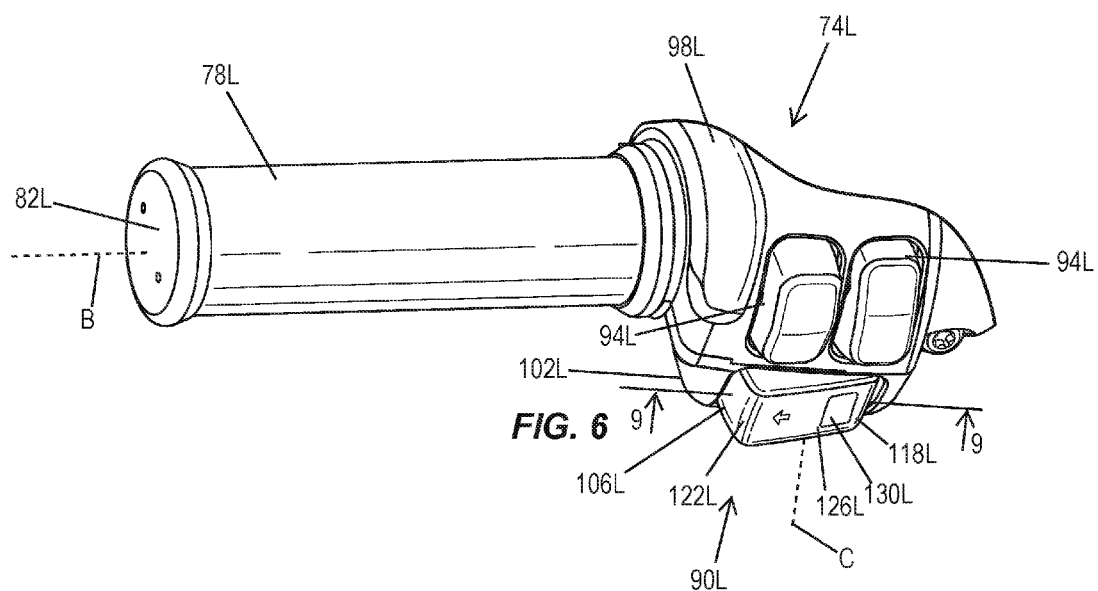

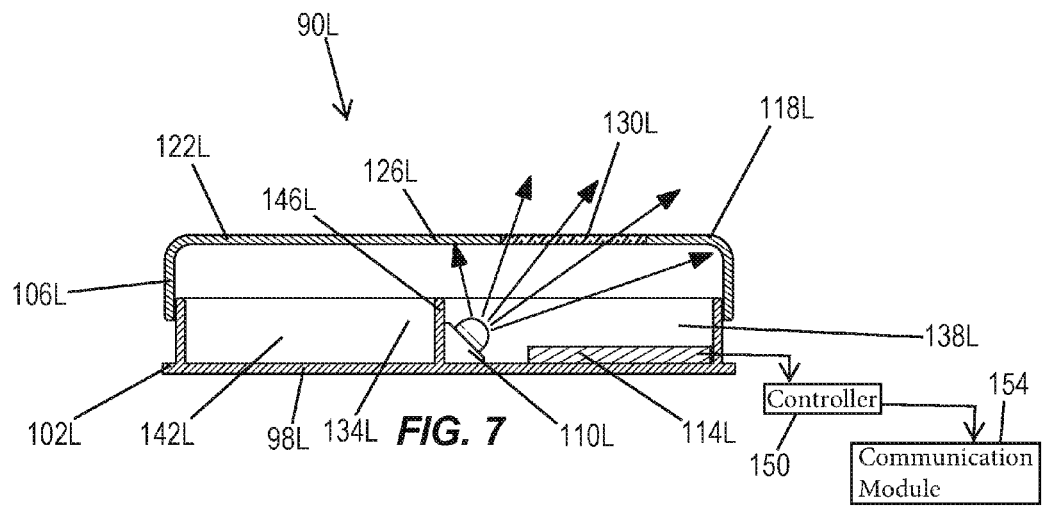
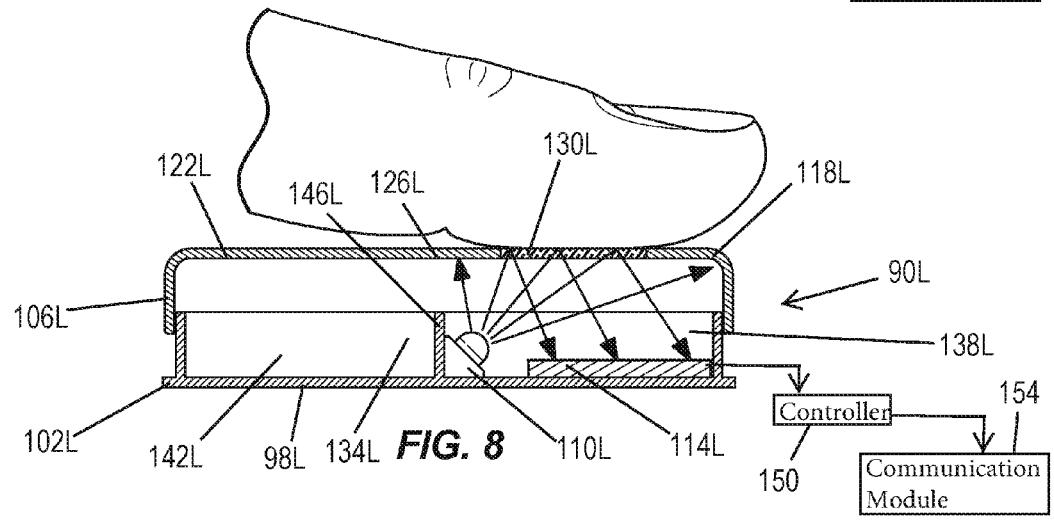
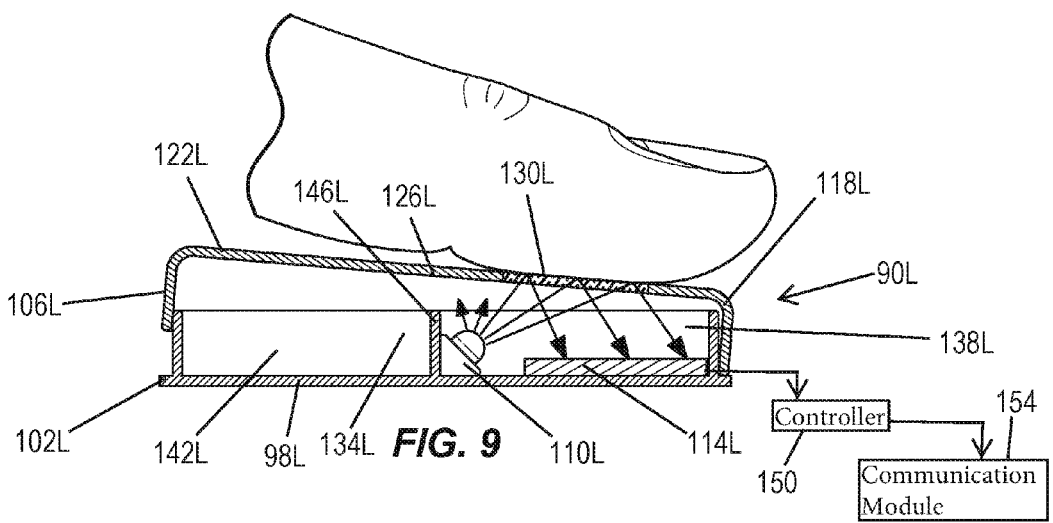

MOTORCYCLE HAND CONTROL WITH OPTICAL SENSOR

BACKGROUND

The present disclosure relates to electronic hand controls for a motorcycle.

SUMMARY

In one aspect, the invention provides a handlebar assembly for steering a vehicle. The handlebar assembly includes a handlebar, a grip positioned on the handlebar at a first end of the handlebar assembly, and a hand control assembly positioned adjacent the grip. The hand control assembly includes an optical sensor. The optical sensor has a housing with a light transmissive section, a light source configured to emit light, and a light sensor configured to detect light. The light source and the light sensor are positioned at least partially within the housing. The optical sensor is operable to detect movement of a vehicle operator along the light transmissive section of the housing by detecting reflected light from the light source with the light sensor.

In another aspect, the invention provides a motorcycle. The motorcycle includes a steering assembly coupled to a front wheel of the motorcycle. The steering assembly includes a handlebar assembly having a handlebar, a grip positioned on the handlebar at a first end of the handlebar assembly, and a hand control assembly positioned adjacent the grip. The hand control assembly includes an optical sensor. The optical sensor has a housing with a light transmissive section, a light source configured to emit light, and a light sensor configured to detect reflected light. The light source and the light sensor are positioned at least partially within the housing such that the optical sensor is operable to detect movement of an operator's hand and output a corresponding output signal. The motorcycle also includes a controller operable to track the output signal to determine an amount and direction of movement of the operator's hand across the light transmissive section, such that the optical sensor provides an interface for controlling at least one user operable system of the motorcycle.

In yet another aspect, the invention provides a method for providing an interface between a motorcycle and a user of the motorcycle. The method includes providing a motorcycle handlebar assembly including a grip and a hand control assembly. The hand control assembly includes an optical sensor. The optical sensor has a housing with a light transmissive section, a light source configured to emit light, and a light sensor configured to detect reflected light and emit an output signal indicative of movement of an operator along the light transmissive section based on the reflected light detected. The method also includes tracking, with a controller, the output signal of the optical sensor to determine an amount and direction of movement of the operator along the light transmissive section, and emitting, from the controller to the at least one user operable motorcycle system, an output signal in response to the controller identifying that the movement of the operator exceeds a threshold amount of movement in a predetermined direction.

Other aspects of the disclosure will become apparent by consideration of the detailed description and accompanying drawings.

BRIEF DESCRIPTION OF THE DRAWINGS

FIG. 5 is a perspective view of a portion of the left hand control assembly of FIG. 3 with a switch body in a second position.

FIG. 6 is a perspective view of the portion of the left hand control assembly of FIG. 5 with the switch body in a third position.

FIG. 7 is a cross section view of the optical sensor, taken along line 7-7 of FIG. 4.

FIG. 8 is a cross section view similar to FIG. 7, with a rider covering a light transmissive section.

FIG. 9 is a cross section view of the optical sensor, taken along 9-9 of FIG. 6 with a rider covering the light transmissive section.

DETAILED DESCRIPTION

Before any embodiments of the disclosure are explained in detail, it is to be understood that the disclosure is not limited in its application to the details of construction and the arrangement of components set forth in the following description or illustrated in the following drawings. The disclosure is capable of other embodiments and of being practiced or of being carried out in various ways.

Figure 1:
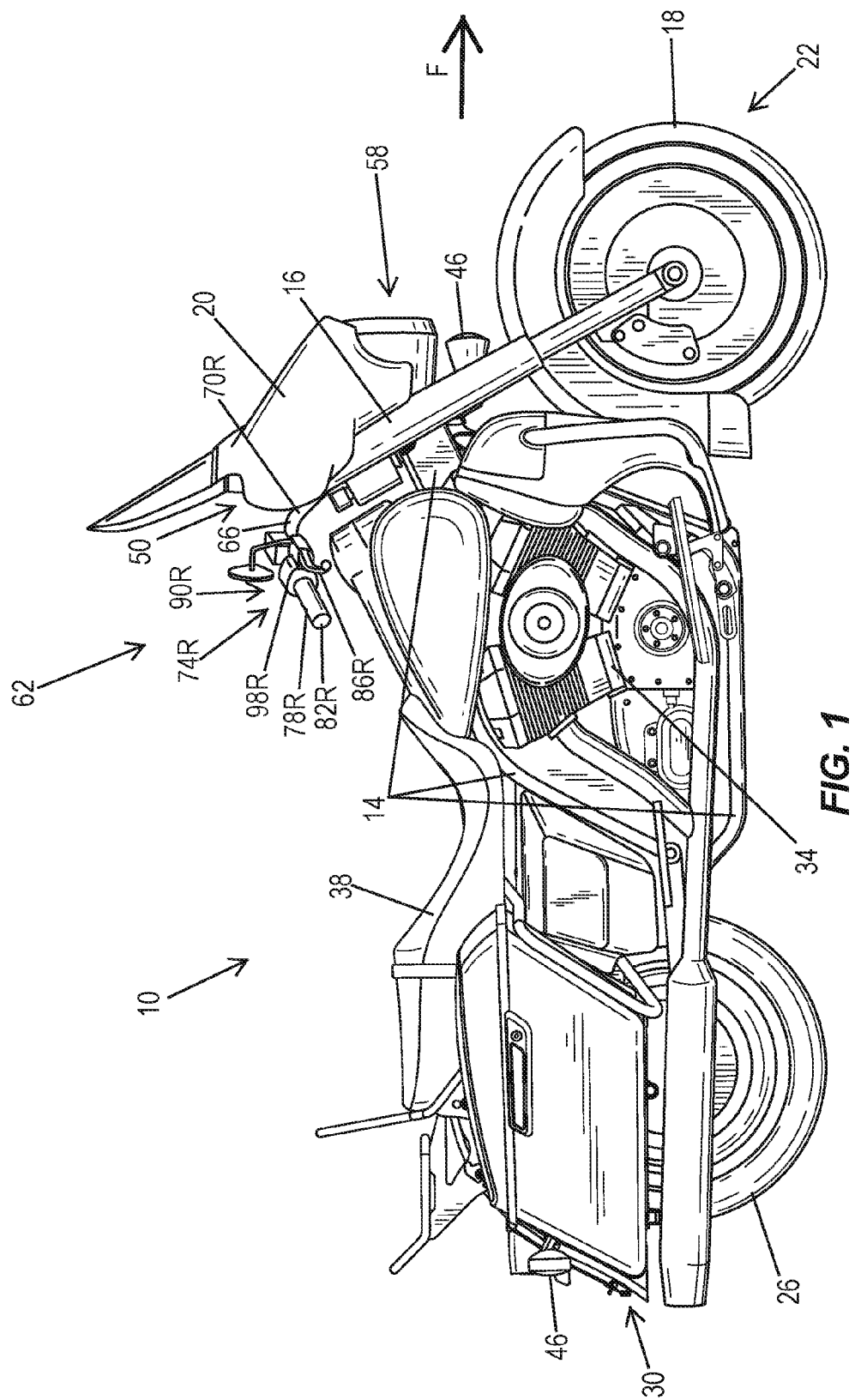
FIG. 1 is a side view of a motorcycle including hand controls with an optical sensor.

FIG. 1 illustrates a motorcycle 10 that includes a frame 14, a front wheel 18 positioned at a front end 22 of the motorcycle 10, and at least one rear wheel 26 positioned at a rear end 30 of the motorcycle 10. A longitudinal center plane A of the motorcycle 10 divides the motorcycle 10 into left and right sides. An engine 34 is configured to drive the at least one rear wheel 26 in a forward direction of travel F along the longitudinal center plane A of the motorcycle 10. A seat 38 is provided for a rider. The seat 38 is coupled to the frame 14 between the front wheel 18 and the at least one rear wheel 26 and is positioned generally above the engine 34. Right turn indicators 46 are provided so the rider may signal an impending movement to the right. Although not illustrated, the left side of the motorcycle 10 includes left turn indicators so the rider may also signal an impending movement to the left.

Figure 2:
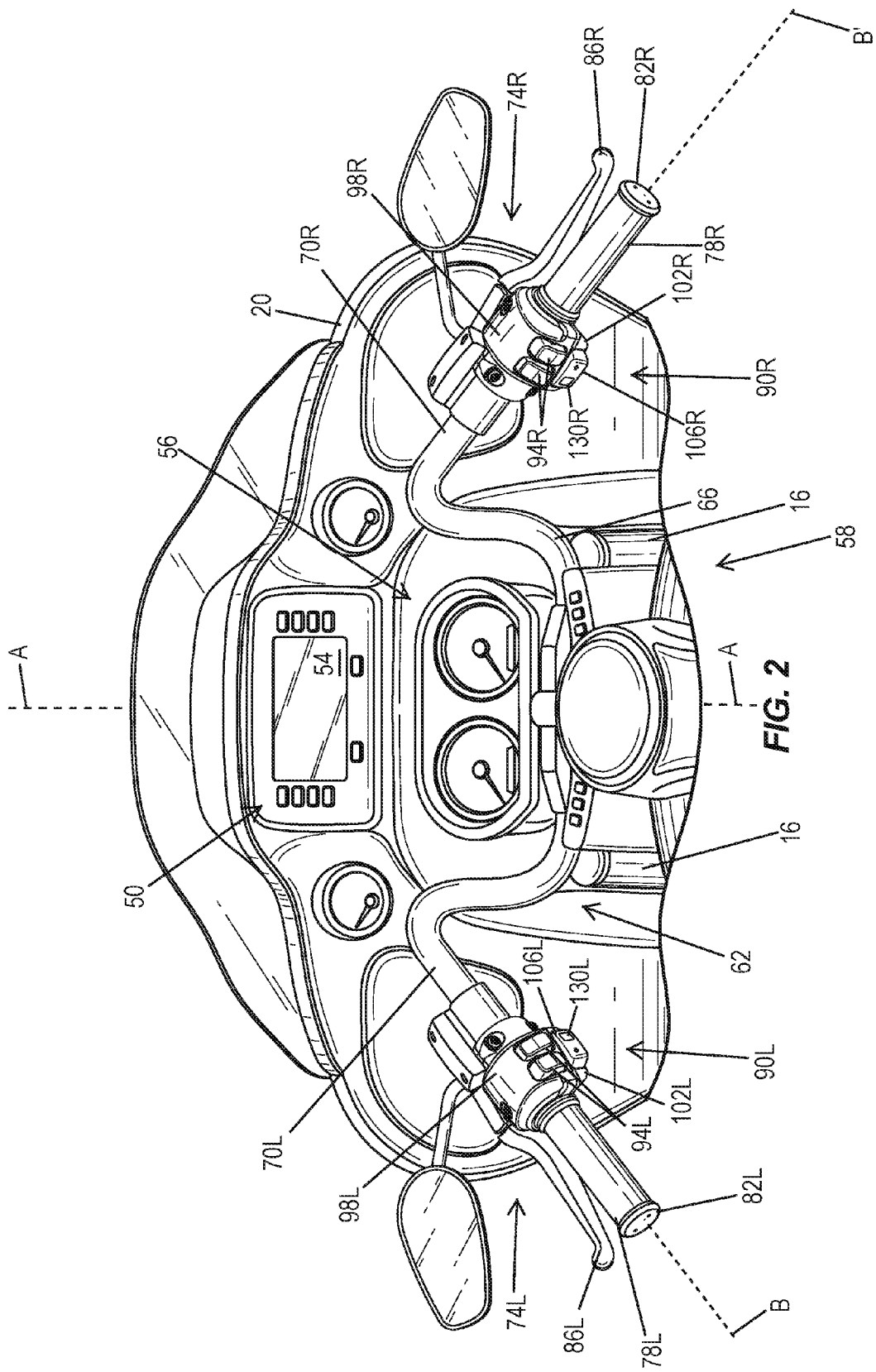
FIG. 2 is a rear view of a center console and handlebar assembly of the motorcycle of FIG. 1.

As illustrated in FIG. 2, the motorcycle 10 also includes a center console 50 having a display 54 and a steering assembly 58 configured to steer the motorcycle 10 while the motorcycle 10 is traveling. The steering assembly 58 is coupled to the front wheel 18 and includes a handlebar assembly 62. The steering assembly 58 is pivotably coupled to the frame 14, and more particularly, to a front fork 16 of the frame 14 so that the rider may maneuver the motorcycle while traveling. A front fairing 20 is supported by the steering assembly 58 at the front end 22 of the motorcycle 22. The center console 50 may be positioned inside the front fairing 20, as further illustrated in FIG. 1. The center console 50 includes the display 54 and may additionally include an instrument panel 56 for displaying information about the motorcycle 10 to the rider 10, such as a travelling speed, an amount of fuel in a fuel tank, among other things. In other embodiments, the front fairing 20 may be fixed relative to the frame 14 such that the steering assembly 58 pivots with respect to the front fairing 20. In yet other embodiments, example motorcycles without front fairings, the center console 50 may be positioned elsewhere on the motorcycle 10 (e.g., the center console 50 may be positioned on the fuel tank, positioned directly on the steering assembly 58, etc.).

Further illustrated in FIG. 2, the handlebar assembly 62 includes a left handlebar portion 70L and a right handlebar portion 70R of a single, unitary handlebar 66. In some embodiments the left handlebar portion 70L and the right handlebar portion 70R are separately formed pieces that are adjoined to the motorcycle 10 at the front end 22. For example, the left handlebar portion 70L and the right handlebar portion 70R may be adjoined to the motorcycle 10 at the front fork 16. The left handlebar portion 70L and the right handlebar portion 70R of the handlebar 66 define respective longitudinal handlebar portion axes (or "grip axes") B, B', respectively. The handlebar assembly 62 also includes a left hand control assembly 74L positioned on the left handlebar portion 70L, a left grip 78L positioned at a distal end 82L of the left handlebar portion 70L, a left lever 86L, a right hand control assembly 74R positioned on the right handlebar portion 70R, a right grip 78R positioned at a distal end 82R of the right handlebar portion 70R, and a right lever 86R. Each grip 78L, 78R is positioned outward, with respect to the longitudinal plane A, of the hand control assembly 74L, 74R of the same side (e.g., the left grip 78L is exterior to the left hand control assembly 74L). The left lever 86L is configured to actuate the clutch of the motorcycle 10, whereas the right lever 86R is configured to actuate the front brake of the motorcycle 10. Each lever 86L, 86R is positioned adjacent the respective grip 78L, 78R of the same side.

Figure 3:
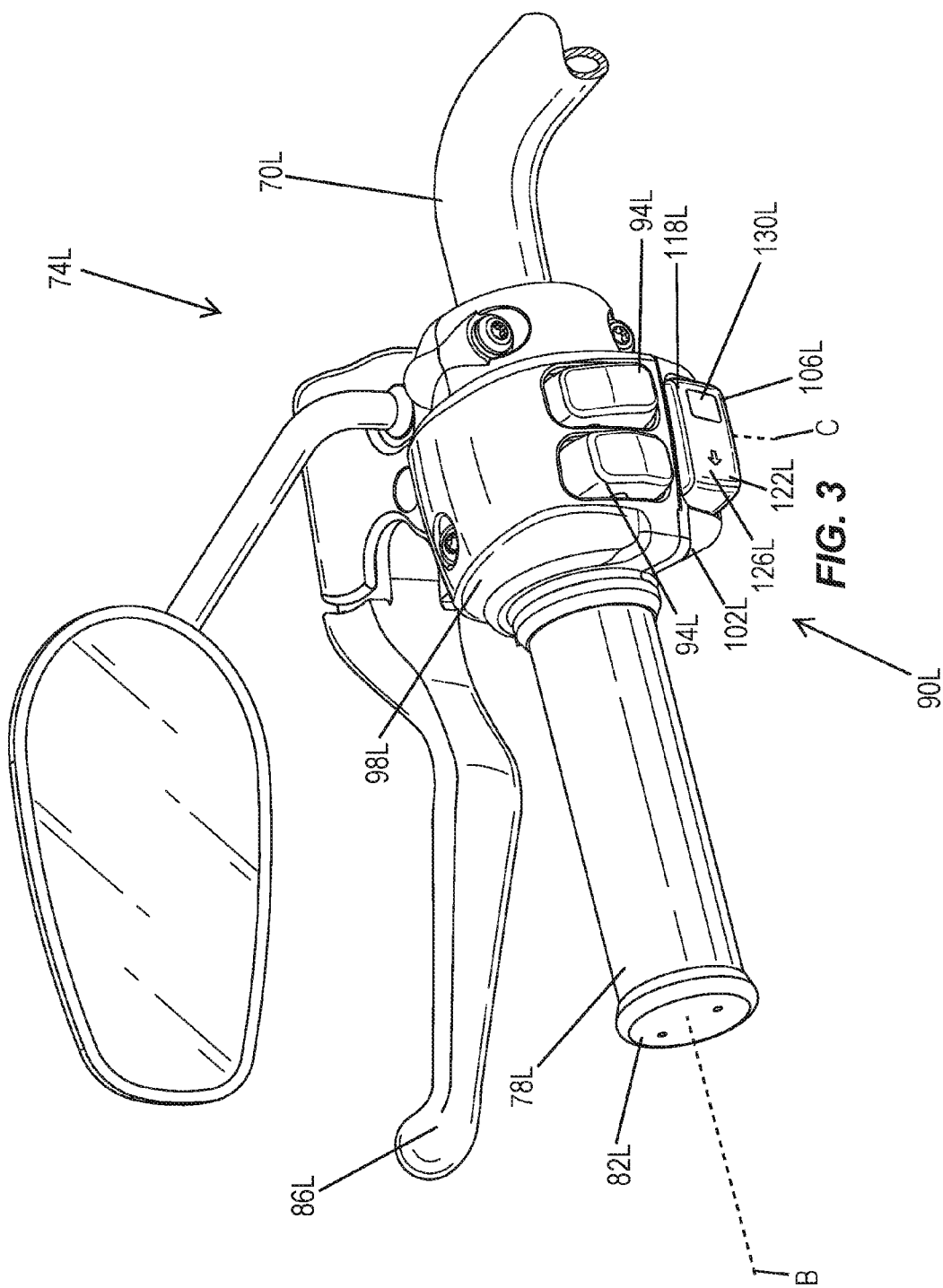
FIG. 3 is a perspective view of a left hand control assembly of the handlebar assembly of FIG. 2.
Figure 4:
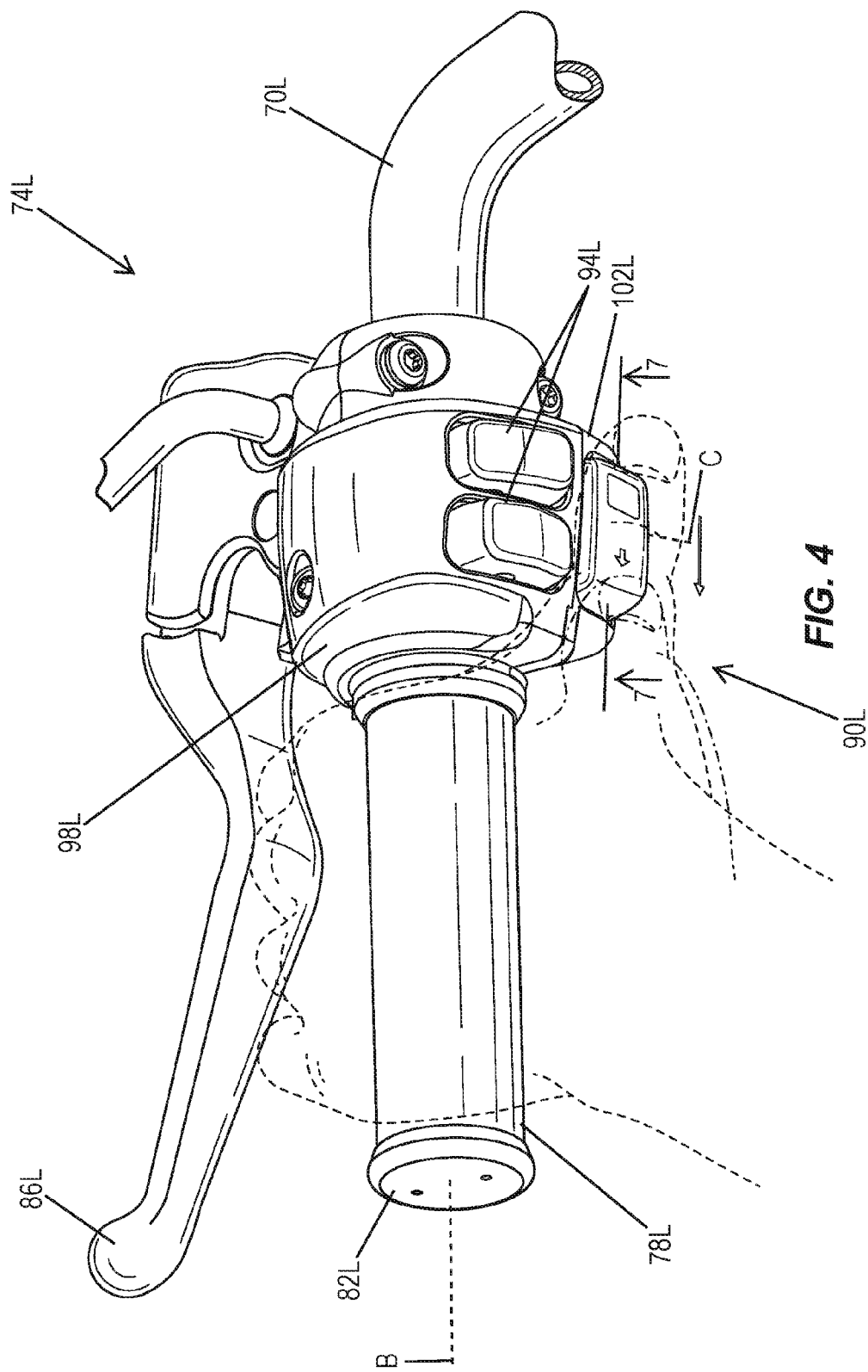
FIG. 4 is a perspective view of the left hand control assembly of FIG. 3 including a hand of a rider shown by phantom lines.

As illustrated in FIGS. 3-6, the left hand control assembly 74L includes an optical sensor 90L, hand control switches 94L, and a housing 98L that is positioned about the left handlebar portion 70L and is adjacent the left grip 78L. In the illustrated embodiment of FIG. 3, the housing 98L is positioned close to the left grip 78L to allow the rider to maintain their riding position and operate the left hand control assembly 74L, as illustrated in FIG. 4 and explained in further detail below. The optical sensor 90L is positioned at a lower end 102L of the housing 98L to facilitate use by the rider, and more particularly, for the rider's thumb. The housing 98L, 98R may be positioned next to the respective grip 78L, 78R such that the optical sensor 90L, 90R is not more than 3 inches away from the respective grip 78L, 78R.

As illustrated in FIGS. 7-9, the optical sensor 90L includes a housing, a light source 110L configured to emit light, and a light sensor 114L configured to detect light. The optical sensor housing, which may include a switch body 106L as discussed below, includes a light transmissive section 130L. The light source 110L is arranged to emit light toward and through the light transmissive section 130L, and the light sensor 114L is arranged to detect reflected light as an operator moves their hand across the light transmissive section 130L. The light sensor 114L may include one or both of an array of photodiodes and an image sensor. The light source 110L may include an LED that emits infrared light. In other embodiments, the light source 110L may include an LED that emits visible light or a combination of infrared and visible light. The housing of the optical sensor 90L generally provides a space for positioning at least part of the light source 110L and the light sensor 114L therein. In the embodiment illustrated in FIGS. 2-9, the housing of the optical sensor 90L is provided by the housing 98L and a switch body 106L movably supported by the housing 98L, as described in greater detail below. In other embodiments, the housing of the optical sensor 90L may be provided solely by the housing 98L or by the handlebar portion 70L. In yet other embodiments, the optical sensor 90L may have a discrete housing removably attached to the handlebar portion 70L, the left grip 78L, or the hand control assembly housing 98L.

As further illustrated in FIGS. 2-9, the switch body 106L may be a rocker switch that is configured to pivot about a rocker axis C on the housing 98L of the left hand control assembly 74L. The rocker axis C may be substantially perpendicular to the longitudinal handlebar portion axis B. The switch body 106L is configured to pivot or rock between a first (e.g., at-rest) position, illustrated in FIGS. 3, 4, 7, and 8, a second (e.g., left depressed) position, illustrated in FIG. 5, and a third (e.g., right depressed) position, illustrated in FIGS. 6 and 9. In other embodiments, the switch body 106L may be a push button (not illustrated) that is movable between a first (e.g., at-rest) position and a second (e.g., pushed-down) position. The left hand control assembly 74L may also include a biasing member (not illustrated) that urges the switch body 106L toward the first position. Although the hand control assembly 74L is shown and described above as including a switch body 106L movable relative to the housing 98L, in other embodiments the switch body 106L, and more generally the housing of the optical sensor 90L, may be fixed on the hand control assembly 74L.

The switch body 106L has a first portion 118L and a second portion 122L that are generally separated by the rocker axis C. The light transmissive section 130L, of the switch body 106L is provided at an outer surface 126L on the first portion 118L. The light transmissive section 130L may be constructed as a piece of light transmissive glass or plastic. As illustrated in the embodiment of FIG. 3, the first portion 118L is positioned closer to the center plane A than the second portion 122L. Accordingly, the light transmissive section 130L is positioned farther away from the left grip 78L than the second portion 122L of the switch body 106L.

The housing of the optical sensor 90L includes a cavity 134L defined between the housing 98L and the switch body 106L. The light source 110L and the light sensor 114L are each generally positioned within the cavity 134L. The cavity 134L includes a first half 138L and a second half 142L with a divider 146L positioned therebetween. The divider 146L may be aligned with the rocker axis C so that the first half 138L is generally defined between the first portion 118L of the switch body 106L and the housing 98L, and so that the second half 142L is generally defined between the second portion 122L of the switch body 106L and the housing 98L, as shown in FIGS. 7-9. In the illustrated embodiment of FIGS. 8 and 9, the light source 110L and the light sensor 114L are positioned in the same half and at the same side of the switch body 106L as the light transmissive section 130L. The light source 110L is positioned such that at least a portion of the light emitted by the light source 110L projects through the light transmissive section 130L, as illustrated in FIG. 7. In particular, the light source 110L and the light sensor 114L are positioned at opposite ends in a single half of the switch body 106L.

It should be understood that although the right hand control assembly 74R is not described in detail above, the right hand control assembly 74R includes the same components and is generally constructed in the same fashion as the left hand control assembly 74L, but as a mirrored opposite, as illustrated in FIG. 2.

The motorcycle 10 further includes a controller 150 and a communication module 154. The controller 150 is electronically coupled to the left hand control assembly 74L and the right hand control assembly 74R and is configured to receive signals from the left optical sensor 90L, the right optical sensor 90R, and the hand control switches 94L, 94R of each hand control assembly 74L, 74R, among other components. The controller 150 is also electronically coupled to the communication module 154 so as to send signals to and receive signals from the communication module 154, as explained in further detail below. The communication module 154 may be separate from or integrated as a part of the controller 150.

The controller 150 is operable to track an output signal of the light sensors 114L, 114R to determine an amount and a direction of movement of the rider across the optical sensors 90L, 90R. The output signals of the light sensors 114L, 114R correspond to the light detected by the light sensors 114L, 114R. The controller 150 is configured to recognize and track patterns of light detected by the light sensors 114L, 114R to determine the amount and direction of movement of the rider, so as to determine an output signal to emit and when to do so. The controller 150 may be programmed to include preconfigured thresholds generally corresponding to two perpendicular axes. Thus, the controller 150 converts continuous motion to a discrete signal. The two perpendicular axes may further correspond to a 'left', 'right', 'up', and 'down' action. The controller 150 is then operable to determine if the movement of the rider has surpassed the threshold in the programmed direction. In the example shown by FIG. 4, the rider moves their thumb predominantly to the left, but the thumb may include some upward and downward movement detected by the controller 150. The controller 150 determines that the motion performed by the rider was not beyond a threshold in the 'up', 'down', and 'right' directions, but was beyond a threshold in the 'left' direction. Accordingly, the controller 150 may emit an output signal corresponding to a 'left' action. In other embodiments, the controller 150 may be configured to include a plurality of thresholds for any operable direction not limited to the two perpendicular axes, but still include 'left', 'right', 'up', and 'down'.

Figure 10:
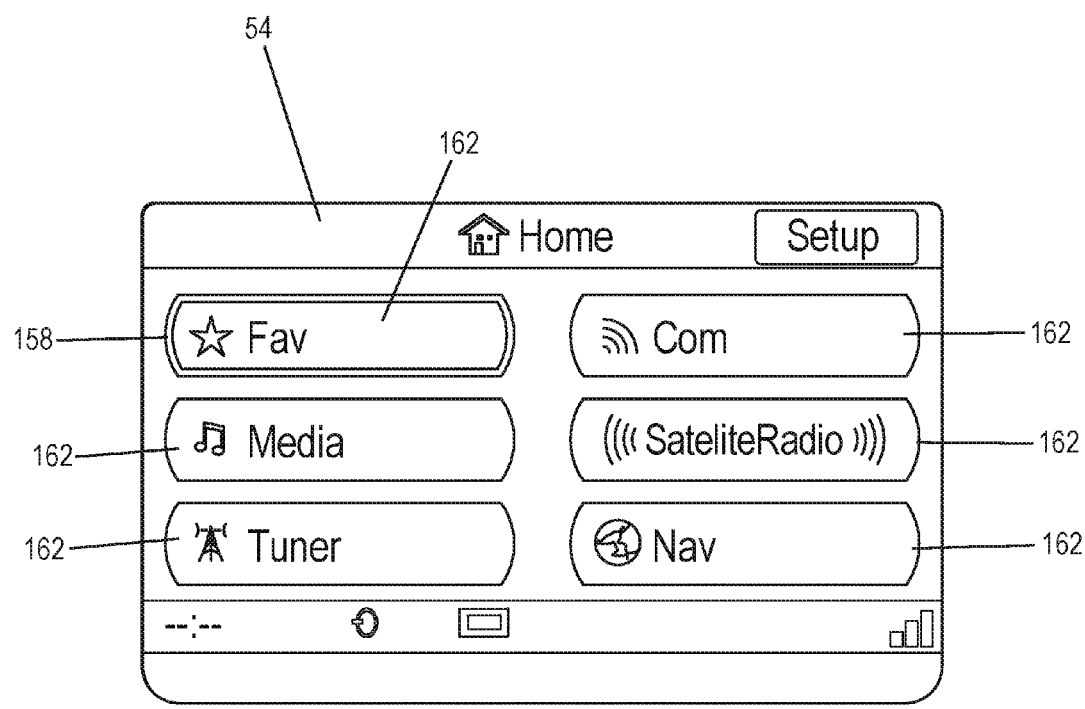
FIG. 10 is a perspective view of a display of the center console of FIG. 2.

The controller 150 and the communication module 154 may be coupled to a plurality of different devices and to a plurality of user operable motorcycle systems by wired connections, wireless connections, or a combination of the two. In general, the controller 150 and the communication module 154 may be coupled to the different devices and/or systems such that the left and right hand control assemblies 74L, 74R, and accordingly each of the optical sensors 90L, 90R provides an interface for controlling one or more motorcycle functions operable by the rider. These functions can include basic operational functions of the motorcycle 10 (e.g., flashers, horn, etc.) or optional convenience functions (e.g., cruise control, radio, etc.), some of which may be user configurable for desired operational characteristics. Furthermore, one or both optical sensors 90L, 90R can be operable to control a remote electronic device paired with the motorcycle 10. In one example, the controller 150 may be coupled to the display 54 of the center console 50. As illustrated by FIG. 10, the display 54 includes an indicator 158 for highlighting one of a plurality of discrete menu items 162. The controller 150, via the communication module 154, is configured to emit signals to the display 54 to move the indicator 158 to different menu items 162 on the display 54 in response to the movement of the user's finger across one of the optical sensors 90L, 90R. For instance, if the controller 150 emits a 'right' action output signal, the indicator 158 moves from the "Fav" menu item 162 to the "Com" menu item 162 of the display 54. If the controller 150 then emits a 'down' action output signal, the indicator 158 will move from the "Com" menu item 162 to the "SatelliteRadio" menu item 162. The rider may make a menu item 162 selection by depressing the switch body 106L to one of the second or third positions, as explained in further detail below. As described above, the discrete outputs of the controller 150 prevent the rider from having to navigate a pointer across the display 54.

The controller 150 may also be coupled to other user operable motorcycle systems, such as the left and right indicators 46 and a cruise control system. For instance, if the controller 150 emits a 'right' action output signal, the right indicators 46 may begin to flash. If the controller 150 emits a 'left' action output signal, the left indicators may begin to flash. If the right indicators 46 are already flashing and the controller 150 emits a 'right' action output signal, the right indicators 46 may stop flashing. If the controller 150 emits a 'down' action output signal, the cruise control system may lower the set cruise control speed. Similarly, if the controller 150 emits an 'up' action output signal, the cruise control system may raise the set cruise control speed.

The communication module 154 may be wirelessly coupled to one or to a plurality of remote electronic devices (not illustrated) that are paired with the motorcycle 10. For example, the remote electronic devices can include a heads-up display on a helmet, a smart phone, a smart watch, a Bluetooth headset, an App for a smart phone or smart watch, various heated rider apparel, a camera, a communication radio or intercom, a siren, an amplifier, ground effects lighting, a garage door opener, or an electronic door lock, among other things.

Other operable actions for the optical sensors 90L, 90R include actuating one or both of the switch bodies 106l, 106R by movement relative to the respective housing 98L, 98R. FIG. 5 illustrates the switch body 106L of the left hand control assembly 74L is actuated to the second position, whereas FIG. 6 illustrates the switch body 106L of the left hand control assembly 74L is actuated to the third position. As similarly described above for a directional action, a depressing action may correspond to different commands depending on the device or motorcycle system that is being controlled. For example, if the left optical sensor 90L is configured to control the display 54, as briefly described above, actuating the switch body 106L to the third position may cause the controller 150 to emit a 'select' action output signal. When actuating the switch body 106L to the second position, the controller 150 may emit a 'back' action output signal, which returns to a previous or higher level menu screen on the display 54. If, continuing from the example above, the indicator 158 is highlighting a "SatelliteRadio" menu item, and the rider actuates the switch body 106L to the third position (FIG. 6), the display 54 may progress to the "SatelliteRadio" submenu. If the switch body 106L is then depressed to the second position (FIG. 5), the display 54 may go back to the previously displayed information.

If the optical sensors 90L, 90R or the controller 150 have been inactive for some predetermined amount of time (e.g., no user commands from one or both of the left hand control assembly 74L and the right hand control assembly 74R), the optical sensors 90L, 90R may default to a non-operational sleep mode. In sleep mode, a number of conditions may be inactive. For example, the controller 150 may not be configured to recognize and track patterns of light detected by the light sensors 114L, 114R, the light sensors 114L, 114R may not be configured to detect light, and/or the light sources 110L, 110R may not be emitting light.

The motorcycle 10 also includes a wake-up operation configured to bring the optical sensors 90L, 90R out of the non-operational sleep mode. The wake-up operation may notify a component of the optical sensors 90L, 90R or the controller 150 to begin to detect a command of one or both of the optical sensors 90L, 90R. For example, the rider may depress the switch body 106L, as illustrated in FIGS. 5, 6, and 9, so that afterward, the controller 150 detects a first pattern of light from the light sensor 114L. The first pattern may be stored by the controller 150 so as to be used as a basis for determining the thresholds for emitting an output signal. In other embodiments, the wake-up function may be triggered by another operation, such as actuating one of the hand control switches 94L, 94R, initiation of a predetermined menu item 162 of the display 54, or initiation of a remote electronic device paired with the motorcycle 10. As mentioned above, the light sources 110L, 110R and the light sensors 114L, 114B may not always be electrically powered. The light sources 110L, 110R may not always be emitting light and the light sensors 114L, 114R may not always be detecting light. Therefore, the wake-up operation may cause the controller 150 to emit an output signal to begin powering one or both of the light sources 110L, 110R and/or the light sensor 114L, 114R.

The motorcycle 10 may include default operations of the left hand control assembly 74L and the right hand control assembly 74R. For example, the left hand control assembly 74L may be initially set to control the indicator 158 for the display 54 and the right hand control assembly 74R may be initially set to control the left indicators, the right indicators 46, and a cruise control setting for the motorcycle 10. For example, as described above, the left optical sensor 90L may control the position of the indicator 158, while actuating the switch body 106L controls selecting the highlighted menu item 162. In other embodiments, the left hand control assembly 74L may control the left indicators, the right indicators 46, and the cruise control setting for the motorcycle 10, while the right hand control assembly 74R is initially set to control the indicator 158 for the display 54. For example, as described above, the right optical sensor 90R may control the position of the indicator 158, while actuating the switch body 106R controls selecting the highlighted menu item 162. In other embodiments, the left hand control assembly 74L and the right hand control assembly 74R may be initially set to control another feature or function of the motorcycle 10 or one of the plurality of remote electronic devices.

After being initially set, the motorcycle 10 may include a menu option 162 (not illustrated in FIG. 10) for reconfiguring the operations of the optical sensors 90L, 90R for each hand control assembly 74L, 74R to something of the rider's choosing. Accordingly, the rider is operable to control a plurality of remote electronic devices, the display 54 of the motorcycle 10, and different user operable motorcycle systems through the optical sensors 90L, 90R. While the motorcycle 10 may include default operations for the left hand control assembly 74L and the right hand control assembly 74R, the operations of the left hand control assembly 74L and the right hand control assembly 74R are variable so that the rider may configure the operations of the motorcycle 10 for their preference.

The above scenarios are listed only as examples for user operable motorcycle systems, remote electronic devices, and operations of the hand control assemblies 74L, 74R and do not exhaust the possibilities of the present disclosure.

In operation, a rider positions their left and right hands over the left grip 78L and the right grip 78R, respectively, while riding. The position of the grips 78L, 78R with relation to the respective left lever 86L or right lever 86R and respective left optical sensor 90L or right optical sensor 90R allows the rider to maintain control of the motorcycle while actuating one or both of the levers 86L, 86R, the optical sensors 90L, 90R, or all of the optical sensors 90L, 90R and the levers 86L, 86R. In particular, the rider may place their fingers over the left grip 78L and the left lever 86L, while the rider's thumb is positioned over the left light transmissive section 130L for operating the left optical sensor 90L. Because the light sensors 114L, 114R detect reflections, the optical sensors 90L, 90R are configured to function the same if the rider is wearing gloves or is barehanded.

To operate the optical sensor 90L, first, a rider positions their thumb over the light transmissive section 130L so that when light is emitted by the light source 110L, the light passes through the light transmissive section 130L and is reflected by the rider's thumb back through the light transmissive section 130L toward the light sensor 114L, as shown in FIGS. 4, 8, and 9. As described above, the optical sensor 90L may first need to be activated from an inactive state. The rider depresses the switch body 106L to the third position, as illustrated by FIGS. 6 and 9, which sends a signal to the controller 150 to wake the motorcycle 10 from the inactive state. The light source 110L begins to emit light and the light sensor 114L begins to detect light and emit an output signal to the controller 150. At least some of the light emitted by the light source 110L is reflected by the rider's thumb and is detected by the light sensor 114L. The light sensor 114L sends the detected light patterns in the output signal to the controller 150 which, after being activated, has begun tracking the output signal of the light sensor 114L. The rider moves their thumb to the left, as illustrated by the phantom lines of FIG. 4, which causes the light pattern detected by the light sensor 114L to change. Accordingly, the output signal emitted by the light sensor 114L is also changed. The controller 150 tracks the output signal of the light sensor 114L to determine if the threshold in any of the preconfigured directions is passed. When the controller 150 detects that the thumb has moved beyond the 'left' action threshold, the controller 150 emits the 'left' action output signal to either the user configurable system of the motorcycle 10 or to the communication module 154 to deliver the 'left' action signal. Thus, an output signal is generated without physical movement of the optical sensor 90L relative to the housing 98L. The rider may then move their thumb back to cover the light transmissive section 130L so that the controller 150 may again detect a first light pattern. As described above, further outputs may be generated by other movements across the optical sensor 90L and/or physical displacement of the switch body 106L relative to the housing 98L.

Although not described in detail herein, the right side of the handlebar assembly 62 may function similarly to the left side of the handlebar assembly 62 that is described above.

In other embodiments (not illustrated), the left hand control assembly 74L may not include a switch body 106L. Therefore, the light transmissive section 130L may be disposed directly on the housing 98L, with the light source 110L and the light sensor 114L positioned so as to be operable by the rider as described above. Accordingly, the optical sensor 90L may be positioned throughout other areas of the steering assembly 58, such as on the handlebar 66 (e.g., directly on or at least partially within the handlebar 66).

In some constructions, the invention may provide an optical sensor integrated into a vehicle other than a motorcycle, such as a bicycle or an automobile. In the case of an automobile, the optical sensor can have a similar construction and function as described above, but may be provided in a steering wheel, armrest, gearshift lever, or other location within the vehicle interior.

Thus, the disclosure provides, among other things, a handlebar assembly for a motorcycle including an optical sensor. Various features and advantages of the disclosure are set forth in the following claims.

What is claimed is:

1. A handlebar assembly for steering a vehicle, the handlebar assembly comprising:
    a handlebar;
    a grip positioned on the handlebar at a first end of the handlebar assembly; and
    a hand control assembly positioned adjacent the grip, the hand control assembly including an optical sensor having a housing with a light transmissive section, a light source configured to emit light, and a light sensor configured to detect light,
    wherein the light source and the light sensor are positioned at least partially within the housing, and
    wherein the optical sensor is operable to detect movement of a vehicle operator along the light transmissive section of the housing by detecting reflected light from the light source with the light sensor.

2. The handlebar assembly according to claim 1, wherein the housing of the optical sensor includes a switch body that is movable, with respect to the handlebar, between a first position and a second position.

3. The handlebar assembly according to claim 2, wherein the switch body is a rocker switch that is configured to pivot about an axis between the first position, the second position, and a third position.

4. The handlebar assembly according to claim 1, wherein the light source includes a light-emitting diode that emits infrared light.

5. The handlebar assembly according to claim 1, wherein the light sensor includes one or both of an array of photodiodes and an image sensor.

6. The handlebar assembly according to claim 1, wherein the grip is a first grip and the hand control assembly is a first hand control assembly, wherein the handlebar assembly further comprises a second grip positioned on the handlebar at a second end of the handlebar assembly and a second hand control assembly positioned adjacent the second grip, wherein the second hand control assembly includes a second optical sensor having a second housing with a second light transmissive section, a second light source configured to emit light, and a second light sensor configured to detect light, wherein the second light source and the second light sensor are positioned at least partially within the second housing, and wherein the second optical sensor is operable to detect movement of the vehicle operator along the second light transmissive section by detecting reflected light from the second light source with the second light sensor.

7. The handlebar assembly according to claim 6, wherein the second housing includes a switch body that is movable, with respect to the handlebar, between a first position and a second position.

8. The handlebar assembly according to claim 7, wherein the vehicle includes a left turn indicator and a right turn indicator, wherein one or both of the optical sensor of the first hand control assembly and the second optical sensor of the second hand control assembly is configured to initiate a signal to activate one of the left turn indicator and the right turn indicator.

9. A motorcycle comprising:
    a steering assembly coupled to a front wheel of the motorcycle, the steering assembly including a handlebar assembly having
    a handlebar,
    a grip positioned on the handlebar at a first end of the handlebar assembly, and
    a hand control assembly positioned adjacent the grip, the hand control assembly including an optical sensor having a housing with a light transmissive section, a light source configured to emit light, and a light sensor configured to detect reflected light, wherein the light source and the light sensor are positioned at least partially within the housing such that the optical sensor is operable to detect movement of an operator and output a corresponding output signal; and
    a controller operable to track the output signal to determine an amount and direction of movement of the operator across the light transmissive section, such that the optical sensor provides an interface for controlling at least one user operable function of the motorcycle.

10. The motorcycle according to claim 9, wherein the housing includes a switch body that is movable, with respect to the handlebar, between a first operational position and a second operational position.

11. The motorcycle according to claim 10, wherein the switch body is a rocker switch that is configured to pivot about an axis between the first position, the second position, and a third position.

12. The motorcycle according to claim 9, wherein the grip is a first grip and the hand control assembly is a first hand control assembly, wherein the handlebar assembly further includes a second grip positioned on the handlebar at a second end of the handlebar assembly and a second hand control assembly positioned adjacent the second grip, wherein the second hand control assembly includes a second optical sensor having a second housing with a light transmissive section, a second light source configured to emit light, and a second light sensor configured to detect light, wherein the second light source and the second light sensor are positioned at least partially within the second housing such that the second optical sensor is operable to detect movement of the operator's hand and output a corresponding output signal, and wherein the controller is further operable to track the output signal of the second optical sensor to determine an amount and direction of movement of the operator along the second light transmissive section such that the second optical sensor provides an interface for controlling at least one additional user operable function of the motorcycle.

13. The motorcycle according to claim 12, wherein the second housing includes a switch body, wherein the switch body of the second optical sensor is movable, with respect to the handlebar, between a first operational position and a second operational position.

14. The motorcycle according to claim 12, wherein the optical sensors of the first and second hand control assemblies are integrated into respective turn signal switches of the motorcycle, such that a secondary motorcycle function is controllable by each turn signal switch via the corresponding optical sensor.

15. The motorcycle according to claim 9, wherein the motorcycle further comprises a communication module operable to communicate with a remote electronic device when the remote electronic device is paired with the motorcycle, and wherein one or both of the optical sensor of the first hand control assembly and the second optical sensor of the second hand control assembly is configured to prompt the controller to send a signal to the remote electronic device through the communication module.

16. A method for providing an interface between a motorcycle and a user of the motorcycle, the method comprising:
providing a motorcycle handlebar assembly including a grip and a hand control assembly, wherein the hand control assembly includes an optical sensor having a housing with a light transmissive section, a light source configured to emit light, and a light sensor configured to detect reflected light and emit an output signal indicative of movement of an operator along the light transmissive section based on the reflected light detected;
tracking, with a controller, the output signal of the optical sensor to determine an amount and direction of movement of the operator along the light transmissive section;
emitting, from the controller to the at least one user operable motorcycle system, an output signal in response to the controller identifying that the movement of the operator exceeds a threshold amount of movement in a predetermined direction.

17. The method according to claim 16, the method further comprising activating one or both of the controller and the optical sensor from an inactive state in response to actuating the hand control assembly.

18. The method according to claim 16, further comprising navigating a menu of a display of the motorcycle in response to the output signal from the controller.

19. The method according to claim 18, wherein the housing includes a switch body that is moveable, with respect to the handlebar, between a first position and a second position, wherein the method further comprises emitting, from the controller, a signal corresponding to actuating the switch body from the first position to the second position, and wherein the signal corresponding to actuating the switch body selects a selection of the menu.

20. The method according to claim 16, further comprising controlling a remote electronic device paired with the motorcycle in response to the output signal from the controller.

\* \* \* \* \*